US012581630B2

(12) United States Patent
Shimizu et al.

(10) Patent No.: US 12,581,630 B2
(45) Date of Patent: Mar. 17, 2026

(54) STORAGE CASE

(71) Applicant: Murata Manufacturing Co., Ltd., Nagaokakyo (JP)

(72) Inventors: Yasuhiro Shimizu, Nagaokakyo (JP); Kiyoyuki Nakagawa, Nagaokakyo (JP)

(73) Assignee: MURATA MANUFACTURING CO., LTD., Kyoto (JP)

( * ) Notice: Subject to any disclaimer, the term of this patent is extended or adjusted under 35 U.S.C. 154(b) by 181 days.

(21) Appl. No.: 18/229,699

(22) Filed: Aug. 3, 2023

(65) Prior Publication Data

US 2023/0380124 A1     Nov. 23, 2023

Related U.S. Application Data

(63) Continuation of application No. PCT/JP2021/041186, filed on Nov. 9, 2021.

(30) Foreign Application Priority Data

Feb. 15, 2021     (JP) ................................. 2021-021900

(51) Int. Cl.
$\quad$ *B65D 85/42* $\qquad$ (2006.01)
$\quad$ *H05K 13/00* $\qquad$ (2006.01)
(52) U.S. Cl.
$\quad$ CPC ......... *H05K 13/0084* (2013.01); *B65D 85/42* (2013.01); *B65D 2203/10* (2013.01)
(58) Field of Classification Search
$\quad$ CPC ................................................... B65D 83/04
$\quad$ USPC ........................................ 221/312; 206/701
$\quad$ See application file for complete search history.

(56) References Cited

U.S. PATENT DOCUMENTS

| | | | | |
|---|---|---|---|---|
| 7,134,571 B2 * | 11/2006 | Hochtritt | .............. | A47K 10/424 |
| | | | | 221/241 |
| 2015/0289731 A1 * | 10/2015 | Lee | ...................... | A47K 10/426 |
| | | | | 221/45 |
| 2015/0332536 A1 * | 11/2015 | Dial, III | ............. | G06K 7/10366 |
| | | | | 221/13 |
| 2015/0342830 A1 * | 12/2015 | Bujalski | ................ | A61J 7/0076 |
| | | | | 221/3 |
| 2016/0008226 A1 * | 1/2016 | Hines | .................... | A61J 7/0481 |
| | | | | 221/121 |

(Continued)

FOREIGN PATENT DOCUMENTS

| | | |
|---|---|---|
| JP | 2005166834 A | 6/2005 |
| JP | 2009199560 A | 9/2009 |

(Continued)

OTHER PUBLICATIONS

International Search Report in PCT/JP2021/041186, mailed Jan. 25, 2022, 3 pages.

(Continued)

*Primary Examiner* — Gene O Crawford
*Assistant Examiner* — Ayodeji T Ojofeitimi
(74) *Attorney, Agent, or Firm* — Keating & Bennett, LLP

(57) ABSTRACT

A storage case includes first-side and second-side wall portions, and a storage space to store components therein and being defined by the first-side and second-side wall portions. The storage case includes a component removal opening and a sloped surface inside the storage space and extending towards the component removal opening. One of the first-side and second-side wall portions defines and functions as a radio wave shield.

16 Claims, 6 Drawing Sheets

(56) References Cited

U.S. PATENT DOCUMENTS

2017/0231438 A1 * 8/2017 Larsson .............. A47K 10/423
221/52

FOREIGN PATENT DOCUMENTS

| JP | 2009295618 A | 12/2009 |
| JP | 2010074066 A | 4/2010 |
| JP | 2010137973 A | 6/2010 |

OTHER PUBLICATIONS

Written Opinion in PCT/JP2021/041186, mailed Jan. 25, 2022, 3 pages.

* cited by examiner

STORAGE CASE

CROSS REFERENCE TO RELATED APPLICATIONS

This application claims the benefit of priority to Japanese Patent Application No. 2021-021900 filed on Feb. 15, 2021 and is a Continuation application of PCT Application No. PCT/JP2021/041186 filed on Nov. 9, 2021. The entire contents of each application are hereby incorporated herein by reference.

BACKGROUND OF THE INVENTION

1. Field of the Invention

The present invention relates to a storage case for electronic components.

2. Description of the Related Art

When mounting electronic components on a substrate, a mounting device is used to install and mount the electronic components at predetermined positions on the substrate. It is necessary to supply electronic components individually to such a mounting device.

Examples of a method of individually supplying electronic components to a mounting device include a tape feeder method in which electronic components are embedded in a tape-shaped carrier and taken out one by one. However, in the tape feeder method, waste such as a tape or a tape cover is generated.

On the other hand, examples of a method of individually supplying electronic components to a mounting device also include a method in which electronic components in a loose state are collectively inserted into a storage case, and the electronic components drop to a feeder by their own weight from a component take-out port provided at a bottom portion of the storage case, and are individually supplied to a mounting device by the feeder (see, for example, Japanese Unexamined Patent Application, Publication No. 2009-295618). In this method, waste such as tape or tape covering does not occur. Furthermore, an RFID tag is attached to the storage case, a reader/writer is provided in the feeder, and the reader/writer exchanges information with the RFID tag.

However, when a plurality of storage cases are provided in the feeder, radio waves from the reader/writer may affect RFID tags provided in adjacent storage cases other than the RFID tags which are targets for exchanging information.

SUMMARY OF THE INVENTION

Preferred embodiments of the present invention provide storage cases in each of which, even when a plurality of storage cases are provided side by side, information from a reader/writer other than a target reader/writer is prevented from being read or written.

A preferred embodiment of the present invention provides a storage case including a first-side wall portion, a second-side wall portion, a storage space to house components therein, the storage space being defined by the first-side wall portion and the second-side wall portion, a component take-out port, and a sloped surface provided inside the storage space and extending toward the component take-out port, wherein one of the first-side wall portion or the second-side wall portion defines and functions as a radio wave shield.

According to preferred embodiments of the present invention, it is possible to provide storage cases in each of which, even when a plurality of storage cases are provided side by side, information from a reader/writer other than a target reader/writer is prevented from being read or written.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Figure 1:
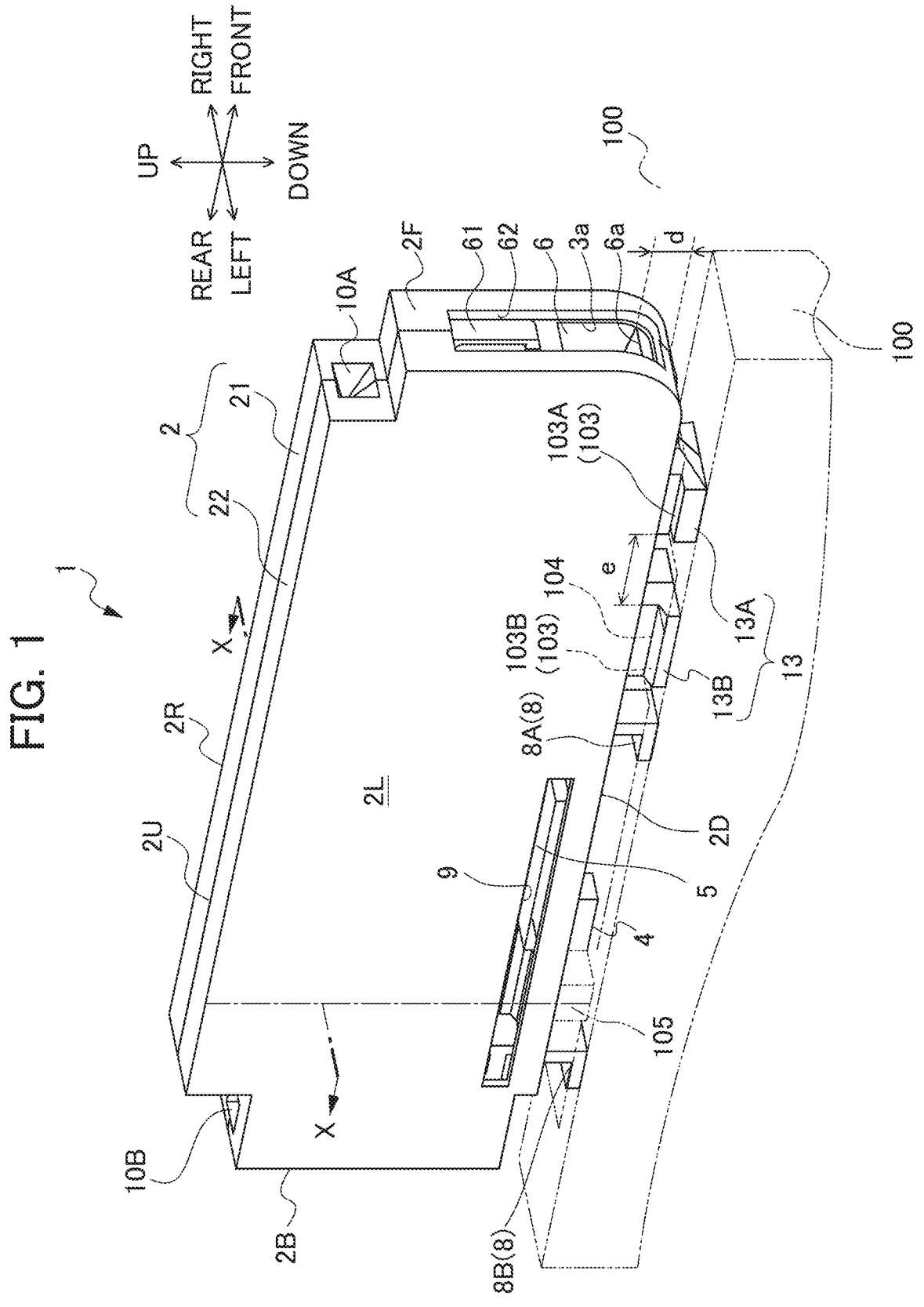
FIG. 1 is a perspective view of a storage case according to a preferred embodiment of the present invention viewed obliquely from above, showing a state in which a component take-out port is opened.

Hereinafter, storage cases according to preferred embodiments of the present invention will be described with reference to the accompanying drawings. FIG. 1 is a perspective view of a storage case 1 according to a preferred embodiment of the present invention viewed obliquely from above. The storage case 1 stores therein electronic components 50 (shown in FIG. 2) as an example of components in a loose state, and is detachable from a feeder 100 shown by a dotted line. The feeder 100 supplies the electronic components 50 flowing out from the storage case 1 to a mounting device (not shown).

In the present preferred embodiment, the electronic components 50 are each, for example, a capacitor, an inductor, or the like, and has a longitudinal length of, for example, about 1.2 mm or less. The electronic components 50 each have a rectangular or substantially rectangular parallelepiped shape.

Figure 2:
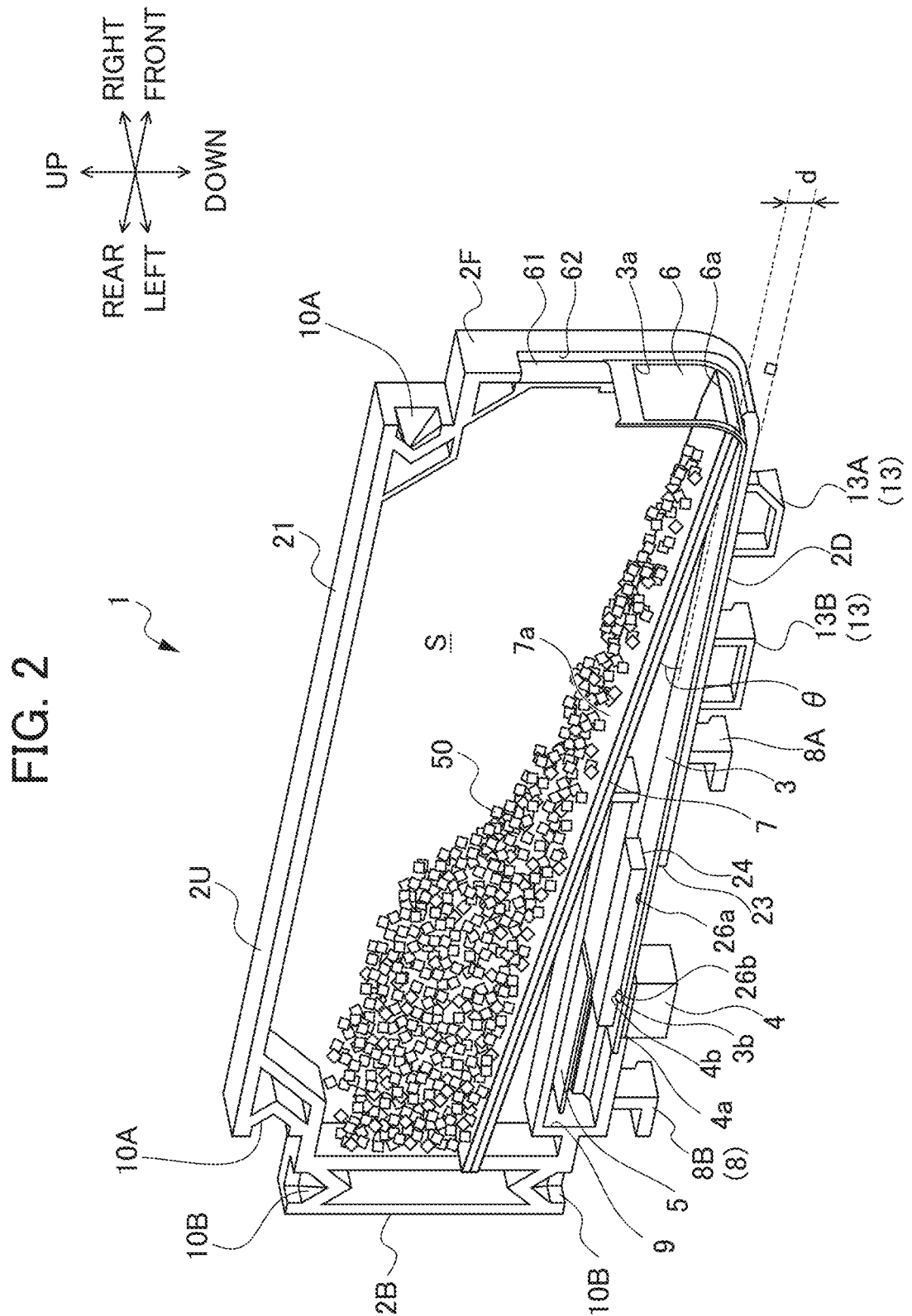
FIG. 2 is a perspective view showing an internal state of a storage case according to a preferred embodiment of the present invention, showing a state in which the component take-out port is opened.
Figure 3:
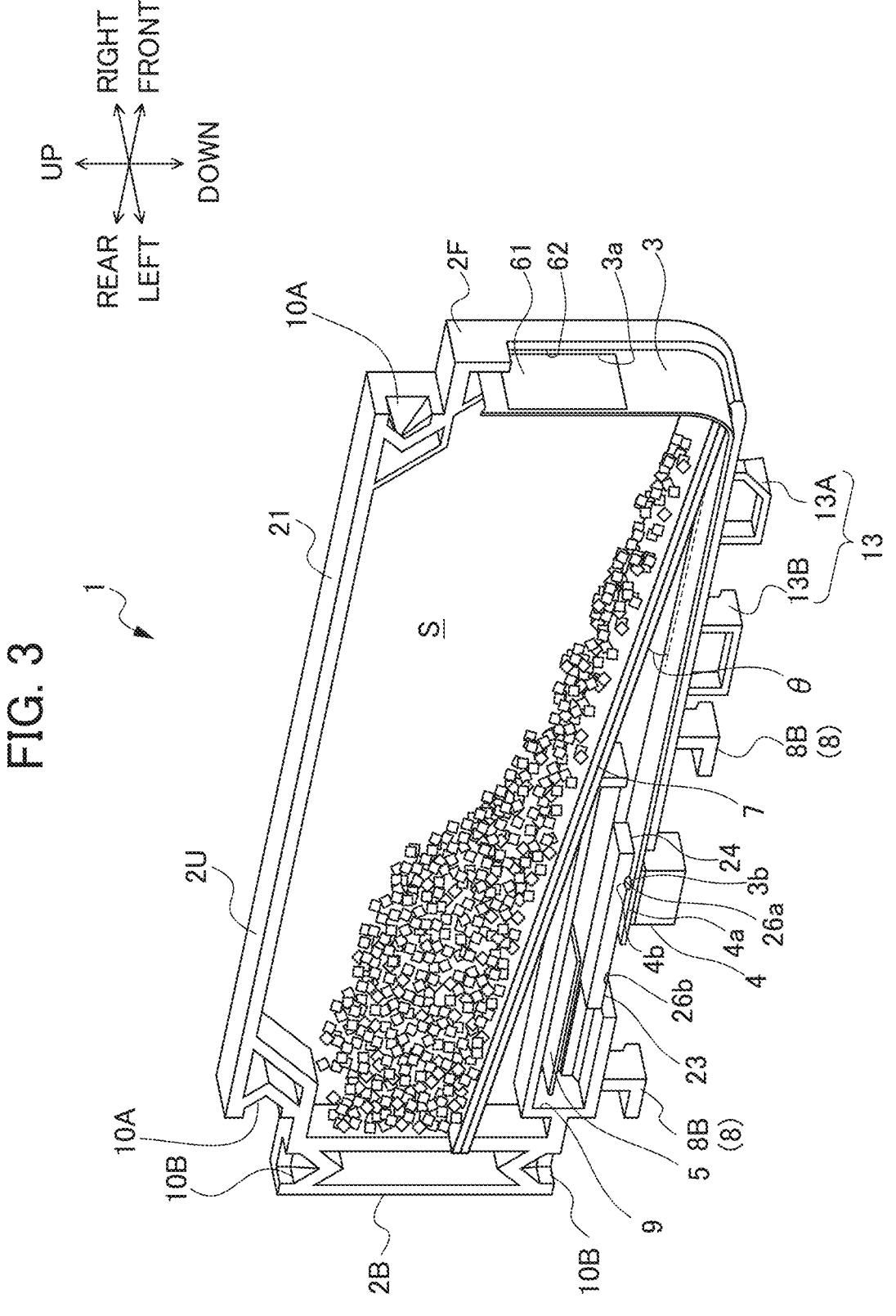
FIG. 3 is a perspective view showing an internal state of a storage case according to a preferred embodiment of the present invention, showing a state in which the component take-out port is closed.

FIG. 2 is a perspective view showing an internal state of the storage case 1 from which a second-side wall portion 22 described later is removed, and showing a state in which the component take-out port 6 is opened. FIG. 3 is a perspective view showing an internal state of the storage case 1 from which a second-side wall portion 22, which will be described later, is removed in the same manner as in FIG. 2, and shows a state in which the component take-out port 6 is closed.

Figure 4:
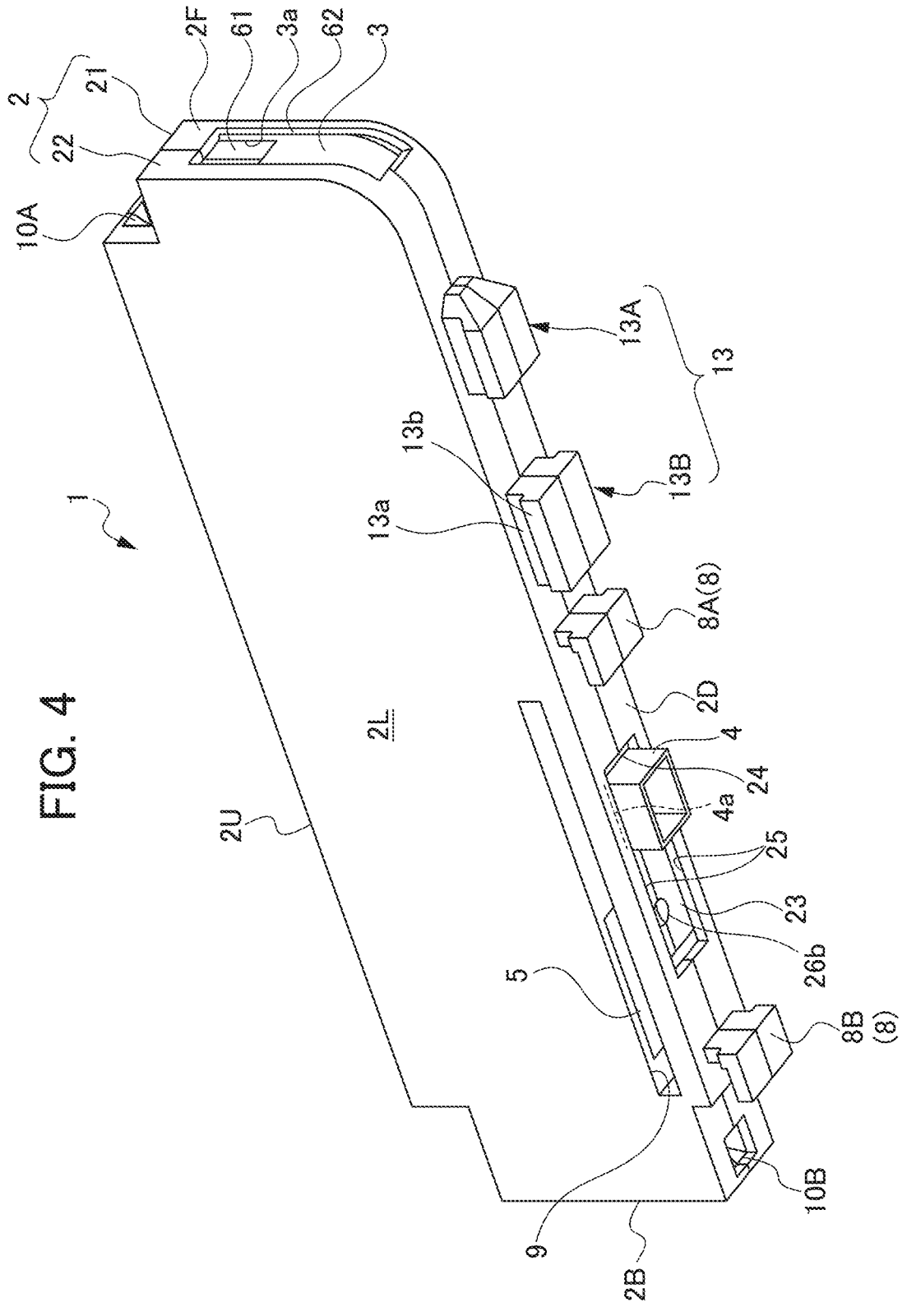
FIG. 4 is a perspective view of a storage case according to a preferred embodiment of the present invention viewed obliquely from below, showing a state in which the component take-out port is closed.

FIG. 4 is a perspective view of the storage case 1 viewed obliquely from below. FIGS. 5A to 5D are diagrams illustrating a method of mounting the storage case 1 to the feeder 100.

Storage Case 1

The storage case 1 includes a case main body 2, a cover 3, and a driver 4, and an information tag housing section 9 to house the RFID tag 5 is provided in the case main body 2.

Case Main Body 2

The case main body 2 includes a first-side wall portion 21 and a second-side wall portion 22, and is a container in which a storage space S is provided by assembling the first-side wall portion 21 and the second-side wall portion 22. The case main body 2 includes an upper wall portion 2U, a bottom wall portion 2D, a front-side wall portion 2F, a rear-side wall portion 2B, a right-side wall portion 2R adjacent to the first-side wall portion 21, and a left-side wall portion 2L adjacent to the second-side wall portion 22. The electronic components 50 are stored in the storage case 1 in a loose state.

In the present disclosure, when the storage case 1 is attached to the feeder 100, the vertical direction of the storage case 1 is defined as the vertical direction of the storage case 1. Furthermore, the side of the storage case 1 on which the component take-out port 6 is provided is referred to as a front side, and the opposite side thereof is referred to as a rear side. The right side and the left side of the storage case 1 when viewed from the front thereof are the right side and the left side, respectively. The first-side wall portion 21 is positioned on the right side, and the second-side wall portion 22 is positioned on the left side.

The front-side wall portion 2F, the rear-side wall portion 2B, the right-side wall portion 2R, and the left-side wall portion 2L are side wall portions extending in a vertical direction, i.e., vertically. The upper wall portion 2U and the bottom wall portion 2D are wall portions extending in the horizontal direction.

In the present preferred embodiment, the second-side wall portion 22, which is one of the first-side wall portion 21 and the second-side wall portion 22, is made of a material having radio wave shielding performance. A material having radio wave shielding performance is an electrically conductive material. The first-side wall portion 21, which is the other side wall portion, is made of, for example, a resin material having an antistatic performance.

However, the present invention is not limited thereto, and for example, the second-side wall portion 22, which is one of the first-side wall portion 21 and the second-side wall portion 22, may be made of a resin material having an antistatic performance equal or substantially equal to that of the first-side wall portion 21, and a material having a radio wave shielding performance may be applied, or a member having a radio wave shielding performance to shield radio waves may be attached. As the surface resistivity of the member is smaller, the radio wave shielding performance becomes higher.

In the present specification, a material having radio wave shielding performance indicates a material having a surface resistivity of, for example, about $10^2$ $\Omega$/sq. or less. The surface resistivity of the material having radio wave shielding performance is more preferably, for example, about 10 $\Omega$/sq. or less.

Component Take-Put Port 6

The component take-out port 6 is provided below the front-side wall portion 2F of the case main body 2. The component take-out port 6 is a quadrangular or substantially quadrangular opening in the present preferred embodiment, but is not limited to a quadrangular or substantially quadrangular shape, and may be, for example, another circular, substantially circular, elliptical or substantially elliptical opening. The position of a lower edge portion 6a when the component take-out port 6 is opened is spaced away from the bottom surface of the bottom wall portion 2D adjacent to the feeder 100 by a predetermined distance d (about 3 mm to about 6 mm, for example) toward the upper side in the vertical direction.

Sloped Surface 7a

In the storage space S, a plate 7 extends between the first-side wall portion 21 and the second-side wall portion 22. The upper surface of the plate 7 is a sloped surface 7a which extends from the rear toward the lower edge portion 6a of the front component take-out port 6 and is sloped so that the lower edge portion 6a becomes the lowest side. The slope angle $\theta$ of the sloped surface 7a is, for example, about 3° to about 10° with respect to the horizontal direction when the storage case 1 is attached to the feeder 100, and is, for example, about 5° in the present preferred embodiment.

The angle is more preferably, for example, about 5° to about 7°.

Cover 3

The cover 3 continuously extends from the bottom wall portion 2D to the front-side wall portion 2F to cover the component take-out port 6. The cover 3 has an elongated belt shape, and the material thereof is not limited thereto, but is, for example, PET (Polyethylene terephthalate) in the present preferred embodiment, and is a material which is rigid to some extent and which can be bent. The width of the cover 3 is slightly larger than the width of the component take-out port 6 and can cover the component take-out port 6 without any gap.

For example, about 1.0×10^6 to about 1.0×10^12 (about $1.0×10^6$ to about $1.0×10^{12}$) is assumed. If it is lower than about 1.0×10^6, a component damage due to a rapid voltage occurs, and if it is higher than about 1.0×10^12, a component adherence due to static electricity occurs.

At the front end of the cover 3, an opening 3a having the same or substantially the same shape as the component take-out port 6 is provided. Although the opening 3a need not have the same or substantially the same shape as the component take-out port 6, an opening which penetrates when the opening 3a and the component take-out port 6 overlap each other defines and functions as an outlet of the electronic component 50.

Guide Groove 62

On the other hand, on the upper side of the component take-out port 6 in the front-side wall portion 2F of the case main body 2, a recess portion 61 for sliding the cover portion which is recessed from the outside toward the inside is provided. On the side surface in the thickness direction of the front-side wall portion 2F of the portion where the component take-out port 6 and the recess portion 61 for sliding the cover portion are provided, guide grooves 62 extending in the vertical direction are provided on the left and right sides. The difference between the width of the guide groove 62 and the thickness of the cover 3 is, for example, about 50 μm to about 80 μm.

Both sides of the cover 3 extending in the longitudinal direction are inserted into the left and right guide grooves 62. The cover 3 is guided by the guide groove 62 and slides on the front-side wall portion 2F in the vertical direction.

Driver 4

A circular or substantially circular hole 3b shown in FIGS. 2 and 3 is provided at the rear end of the cover 3. In the hole 3*b*, a driver 4 that slides and drives the cover 3 is attached. The driver 4 is a rectangular or substantially rectangular member, and a flange portion 4*a* extends outward in the left and right directions on the upper side. A projecting portion 4*b* is provided on the upper surface of the driver 4, and the projecting portion 4*b* is inserted into the hole 3*b* of the cover 3 and projects upward.

On the other hand, as shown in FIG. 4, the bottom wall portion 2D of the storage case 1 is provided with a recess portion 23 to slide the driver which is recessed from outside toward the inside. A long hole 24 through which the cover 3 can be inserted from the inner surface side to the outer surface side of the bottom wall portion 2D is provided in the front-side surface of the recess portion 23 to slide the driver. The cover 3 extends through the long hole 24 to the outer surface side, which is the bottom surface of the recess portion 23 to slide the driver. Two depressions 26*a* and 26*b* are provided side by side in the front-rear direction on the outer surface of the recess portion 23 for sliding the driver.

On side surfaces in the thickness direction of the bottom wall portion 2D at the portion where the recess portion 23 to slide the driver is provided, groove portions 25 to drive are provided which each extend in the front-rear direction on the left and right sides as shown in FIG. 4.

The flange portion 4*a* of the driver 4 is inserted between the left and right groove portions 25 for drive. When the driver 4 is moved back and forth by an operator or another device, the driver 4 is guided to the groove portions 25 to drive and slides inside the recess portion 23 to slide the driver 4 in the front and rear direction. At this time, the sliding range of the driver 4 is between a position where the projecting portion 4*b* fits in the front depression 26*a* and a position where the projecting portion 4*b* fits in the rear depression 26*b*.

Figures 5A, 5B, 5C, 5D:
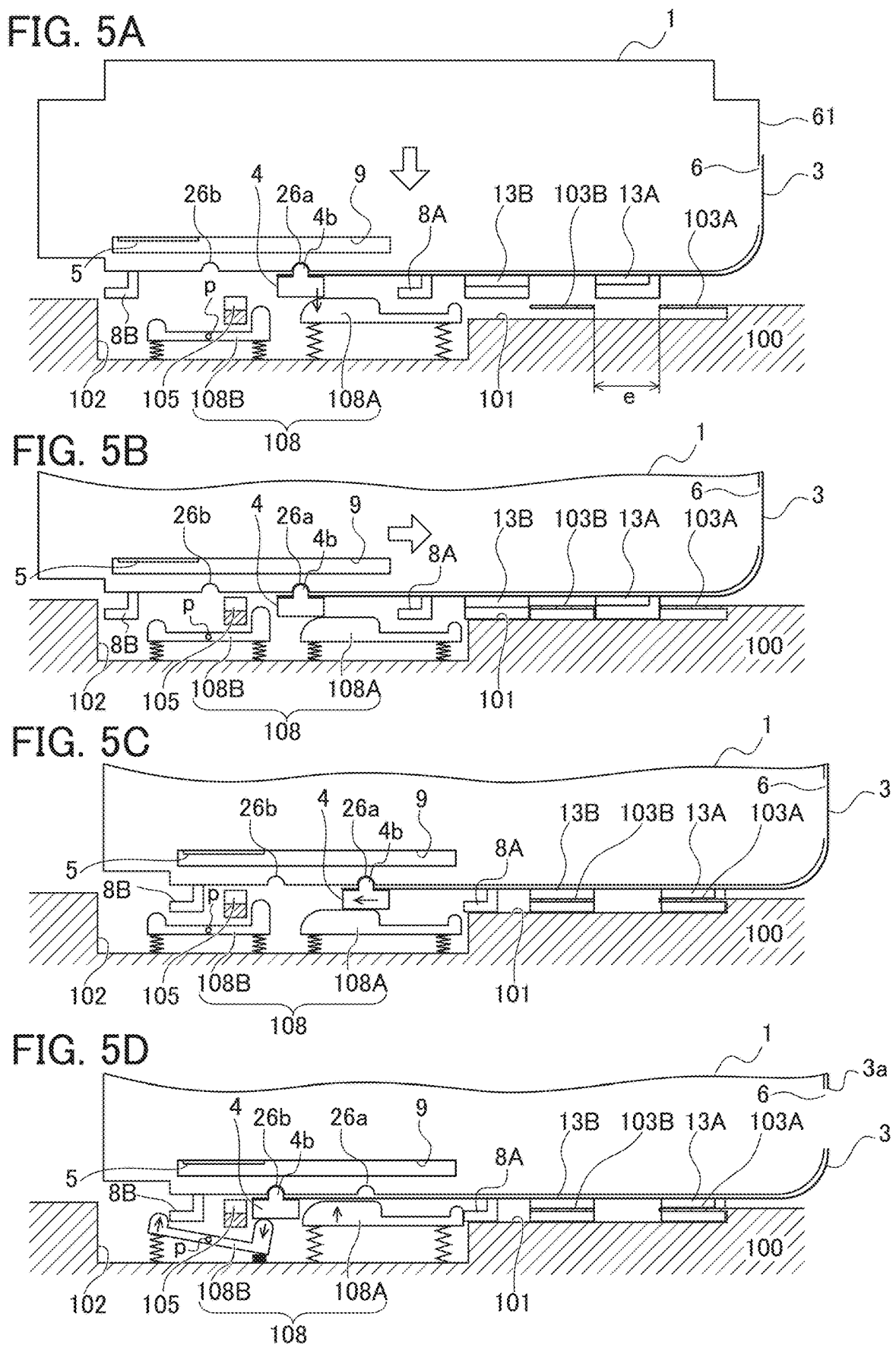
FIGS. 5A to 5D are diagrams illustrating a method of mounting a storage case according to a preferred embodiment of the present invention to a feeder.

Although details of FIGS. 5A to 5D will be described later, as shown in FIGS. 5C and 3, when the projecting portion 4*b* of the driver 4 is in the front depression 26*a*, the opening 3*a* of the cover 3 is positioned in the recess portion 61 to slide the cover portion and does not overlap with the component take-out port 6, such that the entire component take-out port 6 is closed and the electronic components 50 are not discharged to the outside.

As shown in FIG. 5D and FIG. 2, when the projecting portion 4*b* of the driver 4 is in the rear depression 26*b*, the opening 3*a* of the cover 3 overlaps the component take-out port 6 and opens the component take-out port 6. This configuration makes it possible to take out the electronic components 50.

Grip Portion 10

Grip portions 10 are respectively provided on the rear side and the upper side of the case main body 2. In the present preferred embodiment, two kinds of grip portions 10 are provided, i.e., an upper grip portion 10A and a rear grip portion 10B. However, the present invention is not limited thereto, and either one of them may be provided, or the grip portions 10 may be provided at other locations such as right and left, up and down, and the like.

The upper grip portions 10A are depressions provided at both front and rear ends of the upper side of the case main body 2. The rear grip portions 10B are depressions provided at both upper and lower ends of the rear side of the case main body 2. For example, the grip portions 10 are each a robot hand at the time of transportation and, therefore, is used when gripped.

Information Tag Housing Section 9

The case main body 2 further includes an information tag housing section 9 penetrating through the case main body 2 in the left-right direction. An RFID (radio frequency identifier) tag 5 is attached to the upper surface of the inside of the information tag housing section 9.

On the other hand, as shown in FIG. 1, a reader/writer 105 is attached to the feeder 100. When the storage case 1 is attached to the feeder 100, the reader/writer 105 exchanges information with the RFID tag 5 by wireless communication using an electromagnetic field, a radio wave, or the like.

The case main body 2 is further provided with locked portions 8 and T-shaped slot portions 13, each extending downward from the outer surface of the bottom wall portion 2D.

Locked Portion 8

In the present preferred embodiment, two locked portions 8 are provided, i.e., a front locked portion 8A and a rear locked portion 8B.

Hereinafter, portions common to the front locked portion 8A and the rear locked portion 8B will be collectively described as the locked portion 8.

The locked portion 8 extends downward from above, the lower end of the locked portion 8 is bent at or substantially at 90 degrees rearward, and thus has an L-shaped cross section extending vertically and horizontally.

T-Shaped Slot Portion 13

In the present preferred embodiment, the T-shaped slot portion 13 includes two portions, that is, a front T-shaped slot portion 13A and a rear T-shaped slot portion 13B. However, the present invention is not limited thereto, and may include one T-shaped slot portion. However, by dividing into a plurality of sections, the sliding distance of the storage case 1 when the storage case 1 is mounted on the feeder 100 can be shortened. Hereinafter, common portions of the front T-shaped slot portion 13A and the rear T-shaped slot portion 13B will be collectively described as the T-shaped slot portion 13.

As shown in FIG. 4, the T-shaped slot portion 13 includes a narrow neck portion 13*a* extending downward from above and a wide portion 13*b* provided further below the narrow neck portion 13*a*, and thus has a T-shaped cross section extending vertically and horizontally.

Feeder 100

On the other hand, as shown in FIGS. 5A to 5D, the feeder 100 is provided with a first mounting recess portion 101 and a second mounting recess portion 102 recessed downward from the upper surface of the feeder 100.

First Mounting Recess Portion 101

The width in the left-right direction of the first mounting recess portion 101 provided on the front side is the width which allows the wide portion 13*b* of the T-shaped slot portion 13 to be inserted, and the depth thereof in the vertical direction is larger than the length of the wide portion 13*b* in the vertical direction and shorter than the length of the entire front T-shaped slot portion 13A in the vertical direction.

At two locations on the upper portion of the first mounting recess portion 101, holding plate portions 103 with slits 104 shown in FIG. 1 each having a width which does not allow the wide portion 13*b* of the T-shaped slot portion to be inserted, but allows the narrow neck portion 13*a* thereof to be inserted, are provided. The holding plate portions 103 include a front holding plate portion 103A and a rear holding plate portion 103B, and the upper surface of the holding plate portions 103 are a horizontal plane continuous from the upper surface of the feeder 100. The length of the gap e in the front-rear direction between the front holding plate portion 103A and the rear holding plate portion 103B shown in FIG. 5A refers to a length which allows the front T-shaped slot portion 13A to be inserted.

Locking Portion 108

The second mounting recess portion 102 is deeper than the first mounting recess portion 101, and locking portions 108 are provided inside the second mounting recess portion 102. In the present preferred embodiment, the locking portion 108 includes a front locking portion 108A and a rear locking portion 108B corresponding to the front locked portion 8A and the rear locked portion 8B, respectively.

Front Locking Portion 108A

The front locking portion 108A is a plate-shaped member, and is provided with protrusions that extend upward on the front side and the rear side. Springs are provided between the front side and the rear side of the bottom surface of the front locking portion 108A, and the bottom portion of the second mounting recess portion 102 for the attachment therebetween. The front locking portion 108A is movable up and down by the springs.

Rear Locking Portion 108B

The rear locking portion 108B is a plate-shaped member, and is provided with protrusions that extend upward on the front side and the rear side. Springs are provided between the front side and the rear side of the bottom surface of the rear locking portion 108B, and the bottom portion of the second mounting recess portion 102 for the attachment therebetween. The central portion of the rear locking portion 108B is pivotally supported by a shaft p extending in the left-right direction. The rear locking portion 108B is swingable about the shaft.

Mounting Operation

Next, the operation of mounting the storage case 1 to the feeder 100 will be described.

A large number of electronic components 50 are stored inside the storage case 1 in a loose state, and the component take-out port 6 is closed. At this time, the projecting portion 4b of the driver 4 is located in the depression 26a on the front side, and the component take-out port 6 is closed by the opening 3a of the cover 3.

The storage case 1 in this state is brought closer to the feeder 100 by inserting the front T-shaped slot portion 13A of the storage case 1 into the gap between the front holding plate portion 103A and the rear holding plate portion 103B, as shown by the white arrow in FIG. 5A.

Then, the front T-shaped slot portion 13A of the storage case 1 is inserted into the first mounting recess portion 101 through the gap e between the front holding plate portion 103A and the rear holding plate portion 103B. At the same time, the rear T-shaped slot portion 13B of the storage case 1 is inserted into the first mounting recess portion 101 from the rear side of the rear holding plate portion 103B.

At this time, the front locking portion 108A is pressed by the driver 4 and is pressed down against the spring force. The front locking portion 108A does not rotate, and the entire front locking portion 108A lowers.

Next, as shown by the white arrow in FIG. 5B, the entirety of storage case 1 is slid forward.

Then, the front T-shaped slot portion 13A and the rear T-shaped slot portion 13B slide along the bottom surface of the first mounting recess portion 101, and the wide portion 13b of the front T-shaped slot portion 13A enters under the front holding plate portion 103A, and the wide portion 13b of the rear T-shaped slot portion 13B enters under the rear holding plate portion 103B. Thus, the storage case 1 is fixed to the feeder 100.

The front surface of the front T-shaped slot portion 13A is brought into contact with the front surface of the first mounting recess portion 101, such that the storage case 1 is positioned with respect to the feeder 100.

Next, as shown in FIG. 5C, when the driver 4 is moved rearward, the opening 3a of the cover 3 overlaps the component take-out port 6, such that the component take-out port 6 is opened.

At this time, as shown in FIG. 5D, the front protrusion of the rear locking portion 108B is pushed downward by the driver 4. The rear locking portion 108B rotates about the shaft p, and the rear protrusion of the rear locking portion 108B rises. The rear protrusion is brought into contact with the L-shaped rear end of the rear locked portion 8B.

When the driver 4 moves rearward, the pressing of the front locking portion 108A, which has been pressed by the driver 4, is released. Then, the front locking portion 108A rises by the restoring force of the spring, and the protrusion at the front end of the front locking portion 108A comes into contact with the L-shaped rear end of the front locked portion 8A.

In this way, the rear locking portion 108B locks the rear locked portion 8B, and the front locking portion 108A locks the front locked portion 8A. Therefore, while the cover 3 opens the component take-out port 6, the storage case 1 is not detachable from the feeder 100.

In this state, the reader/writer 105 shown in FIG. 1 can exchange information with the RFID tag 5. Since the RFID tag 5 is provided inside the information tag housing section 9, the RFID tag 5 is difficult to be peeled off or damaged even during transportation or the like. The reader/writer 105 reads information provided in the RFID tag 5, and then transmits information of the electronic components accommodated in the case to a controller or the like of the feeder 100.

Figure 6:
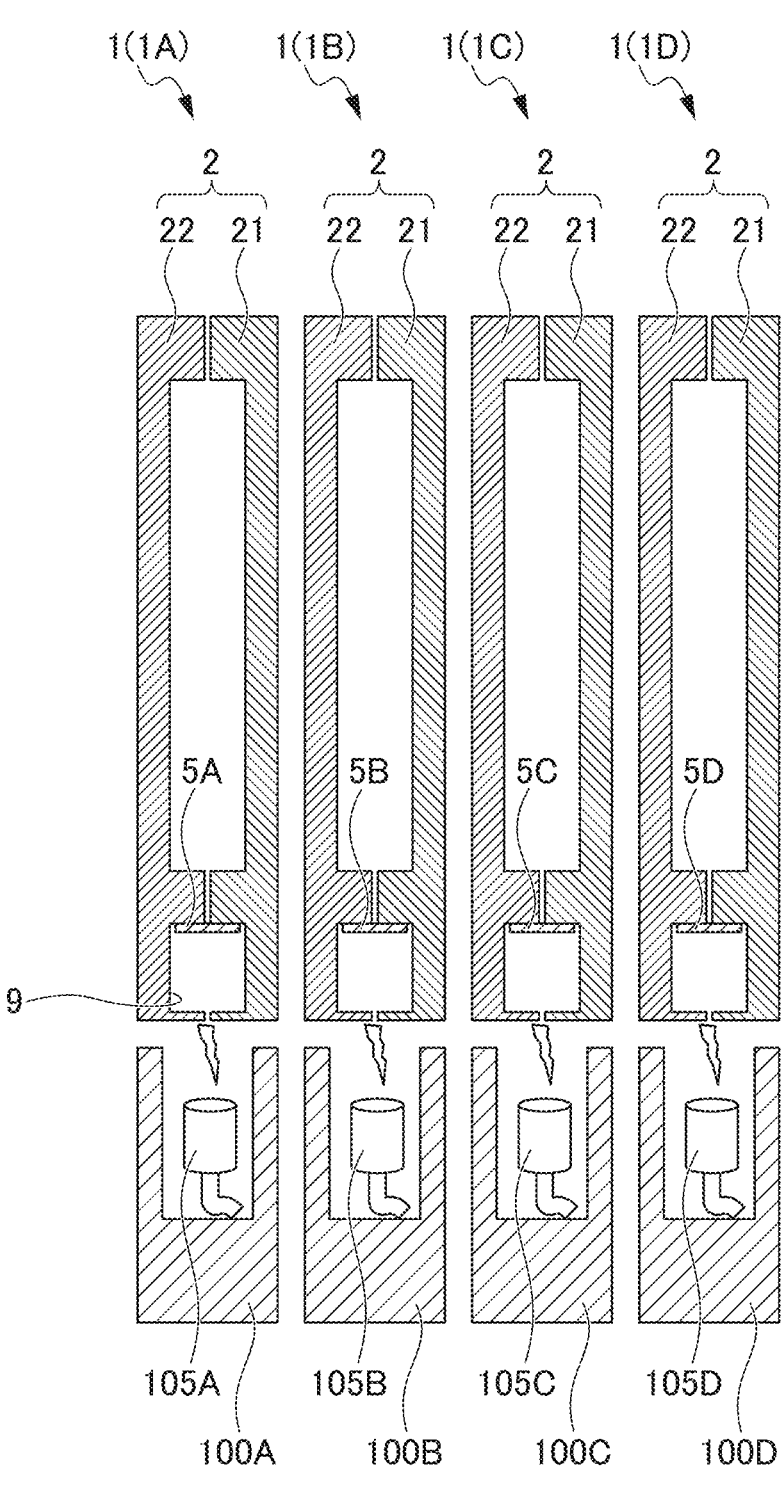
FIG. 6 is a diagram showing a case where a plurality of storage cases 1A, 1B, 1C, and 1D according to a preferred embodiment of the present invention are provided side by side in a feeder 100.

FIG. 6 is a cross-sectional view taken along the line X-X of FIG. 1, showing a case where a plurality of storage cases 1A, 1B, 1C, and 1D are arranged side by side with corresponding feeders 100.

In this case, it is preferable that the RFID tag 5A attached to the storage case 1A exchanges information only with the reader/writer 105A attached to the feeder 100A with which the storage case 1A is arranged.

That is, it is not preferable for the RFID tag 5A to exchange information with the reader/writers 105B, 105C, and 105D attached to the other feeders 100B, 100C, and 100D other than the feeder 100A with which the storage case 1A including the RFID tag 5A is arranged.

In the present preferred embodiment, the second-side wall portion 22, which is one of the first-side wall portion 21 and the second-side wall portion 22, is made of an electrically conductive material and has radio wave shielding performance. Therefore, even when a plurality of storage cases 1A, 1B, 1C, and 1D are arranged side by side with the feeders 100, the RFID tag 5A attached to the storage case 1A is prevented from reading or writing information from a reader/writer other than the reader/writer 105A.

Then, the electronic components 50 slide down along the sloped surface 7a and are discharged from the component take-out port 6. At this time, since the number of the electronic components 50 flowing out per unit time can be controlled by the angle of the sloped surface 7a, it is possible to control the supply speed of the electronic components 50.

The discharged electronic components 50 are transported to a predetermined location by a transport portion (not shown) provided in the feeder 100.

Unlike the present preferred embodiment, when the electronic components 50 fall in the vertical direction due to its own weight, since the electronic component 50 falls at once, the electronic components 50 may be clogged at the component take-out port 6.

However, in the present preferred embodiment, since the number of the electronic components 50 flowing out per unit time can be controlled, regardless of the number of the electronic components 50 housed inside, the electronic component 50 is less likely to be clogged at the component take-out port 6 and does not flow out at once.

Furthermore, since the thickness in the thinnest direction of the electronic component 50 is, for example, about 90 μm to about 700 μm and is larger than about 50 μm to about 80 μm, which is the difference between the width of the guide groove 62 and the thickness of the cover 3, when the electronic component 50 is discharged, the electronic component 50 does not enter the gap between the guide groove 62 and the cover 3. The length of the electronic component 50 in the longitudinal direction is more preferably, for example, about 180 μm to about 330 μm.

In the present preferred embodiment, the position of the lower edge portion 6a when the component take-out port 6 is opened is spaced away by a predetermined distance d from the bottom surface of the bottom wall portion 2D adjacent to the feeder 100 to the upper side in the vertical direction. Therefore, the electronic components 50 that have flowed out do not flow back to the component take-out port 6 from the transport portion (not shown) on the feeder 100 at the drop destination.

When the component take-out port 6 is open, at least the lower edge portion 6a of the component take-out port 6 is located above the lower edge portion of the opening 3a of the cover 3, as shown in FIG. 2. Therefore, when the electronic components 50 flow out, they do not get caught on the lower edge of the opening 3a of the cover 3, and thus the flow of the electronic components 50 is not obstructed.

Since the grip portion 10 is provided in the storage case 1 of the present preferred embodiment, it is possible to set the storage case 1 in the feeder 100 using an automatic robot arm or the like.

Since the case main body 2 includes the RFID tag 5, and the reader/writer 105 is attached to the feeder 100, it is possible to read information of the RFID tag 5 by the reader/writer 105. Therefore, management of the electronic components 50 in the storage case 1 is facilitated.

Modified Preferred Embodiments

Preferred embodiments of the present invention have been described above. However, the present invention is not limited thereto, and various modifications thereto are possible.

For example, in the present preferred embodiment, the T-shaped slot portion 13 is provided in the storage case 1 and the first mounting recess portion 101 is provided in the feeder 100. However, the present invention is not limited thereto, and the T-shaped slot portion may be provided in the feeder and the first recess portion may be provided in the storage case.

Although the locked portion 8 is provided in the storage case 1 and the locking portion 108 is provided in the feeder 100, the locked portion 8 may be provided in the feeder 100 and the locking portion 108 may be provided in the storage case 1.

A vibration device to vibrate the storage case 1 may be separately provided in the feeder 100.

In this case, when the discharge speed of the electronic component 50 decreases, the storage case 1 is vibrated by the vibration device to improve the discharge speed.

Although the sloped surface 7a is a flat surface in the present preferred embodiment, the sloped surface 7a is not limited thereto, and may be a curved surface or the like.

In this case, it may be a curve in the vertical and front-rear cross section, or a curve in the vertical and left-right cross section. Alternatively, a combination of straight lines having different slopes in the vertical and front-rear cross section and the vertical and left-right cross section may be used.

Furthermore, a combination of these curves and straight lines may be used.

The configuration of the locking portion and the locked portion is not limited to the configuration of the present preferred embodiment. Any other configuration may be used as long as the detachment of the storage case 1 from the feeder 100 is restricted while the component take-out port 6 is open.

Furthermore, the RFID tag 5 may be provided at a position other than the information tag housing section 9.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A storage case comprising:
   a first-side wall portion;
   a second-side wall portion;
   a storage space to house components therein, the storage space being defined by the first-side wall portion and the second-side wall portion;
   a component take-out port; and
   a sloped surface inside the storage space and extending toward the component take-out port; wherein
   one of the first-side wall portion or the second-side wall portion defines and functions as a radio wave shield; and
   the sloped surface is defined by a plate extending between the first-side wall portion and the second side-wall portion, and an entirety of the plate is inside of the storage space.

2. The storage case according to claim 1, wherein the one of the first-side wall portion or the second-side wall portion that defines and functions as a radio wave shield is made of a material having radio wave shielding performance.

3. The storage case according to claim 1, wherein a material having radio wave shielding performance is included on the one of the first-side wall portion or the second-side wall portion that defines and functions as a radio wave shield.

4. The storage case according to claim 1, wherein a structure having radio wave shielding performance is attached to the one of the first-side wall portion or the second-side wall portion that defines and functions as a radio wave shield.

5. The storage case according to claim 1, further comprising an information tag housing section in the case main body to house an information tag having information readable by radio wave; wherein
   the one of the first-side wall portion or the second-side wall portion defining and functioning as the radio wave shield prevents information of the information tag provided in the case main body from being read through the one of the first-side wall portion or the second-side wall portion.

6. The storage case according to claim 1, wherein the components are capacitors or inductors.

7. The storage case according to claim 1, wherein each of the components has a longitudinal dimension of about 1.2 mm or less.

8. The storage case according to claim 1, further comprising a case main body, a cover, and a driver to drive the cover.

9. The storage case according to claim 8, wherein the case main body includes the first-side wall portion and the second-side wall portion.

10. The storage case according to claim 1, wherein another one of the first-side wall portion or the second-side wall portion are made of a resin material having an antistatic performance.

11. The storage case according to claim 1, wherein the one of the first-side wall portion or the second-side wall portion that defines and functions as a radio wave shield has a surface resistivity of about $10^2$ $\Omega$/sq. or less.

12. The storage case according to claim 1, wherein the component take-out port includes a quadrangular or substantially quadrangular opening.

13. The storage case according to claim 1, wherein a slope angle of the sloped surface is about 3° to about 10° with respect to a horizontal direction.

14. The storage case according to claim 1, wherein a slope angle of the sloped surface is about 5° to about 7° with respect to a horizontal direction.

15. The storage case according to claim 8, wherein the cover is made of polyethylene terephthalate.

16. The storage case according to claim 8, wherein the cover includes an opening having a same or substantially a same shape as the components.

* * * * *